United States Patent [19]
Tatsumi et al.

[11] Patent Number: 5,354,421
[45] Date of Patent: Oct. 11, 1994

[54] DRY ETCHING METHOD

[75] Inventors: Tetsuya Tatsumi; Shingo Kadomura; Tetsuji Nagayama, all of Kanagawa, Japan

[73] Assignee: Sony Corporation, Tokyo, Japan

[21] Appl. No.: 824,130

[22] Filed: Jan. 22, 1992

[30] Foreign Application Priority Data

Jan. 22, 1991 [JP] Japan .................................. 3-020360

[51] Int. Cl.$^5$ ............................................ H01L 21/00
[52] U.S. Cl. .................................... 156/662; 156/643; 156/646; 156/659.1; 156/656; 156/657
[58] Field of Search ............. 156/646, 662, 643, 659.1, 156/656, 657

[56] References Cited

U.S. PATENT DOCUMENTS

| | | | |
|---|---|---|---|
| 4,350,578 | 9/1982 | Frieser et al. | 204/298 |
| 4,462,863 | 7/1984 | Nishimatsu et al. | 156/646 |
| 4,615,764 | 10/1986 | Bobbio et al. | 156/643 |
| 4,711,698 | 12/1987 | Douglas | 156/643 |
| 4,956,043 | 9/1990 | Kanetomo et al. | 156/345 |
| 4,956,314 | 9/1990 | Tam et al. | |
| 5,118,387 | 6/1992 | Kadomura | 156/643 |
| 5,211,790 | 5/1993 | Tatsumi | 156/643 |

FOREIGN PATENT DOCUMENTS

| | | |
|---|---|---|
| 55-036980 | 3/1980 | Japan . |
| 58-204537 | 11/1983 | Japan . |
| 63-122178 | 5/1988 | Japan . |
| 63-166979 | 7/1988 | Japan . |

OTHER PUBLICATIONS

"Enhancement of RIE Resistance of Conventional Resist Materials", Proc. SPIE-int. Soc. Opt. Eng., 771; abstract only (1987).

"Decomposition of Sulfur Hexaflouride by Arc Discharge and the Determination of the Reaction Product Disulfur Decafluoride", Gasseous Dielectr, Proc. Int. Symp, 5th; Janssen; abstract only (1987).

"Disulfur Dibromide, Disulfur Dichloride, and Disulfur Difluoride: Halogen Compounds for Low-Pressure Plasma Etching", 76-11 Electric Phenomena; Pons et al., abstract only , (1989).

"D.C. Plasma Etching of Silicon by Sulfur Hexafluoride Mass Spectrometric Study of Discharge Products"; Plasma Chem. Plasma Process., 1(2), Wagner et al.; abstract only, (1981).

Primary Examiner—Robert Kunemund
Assistant Examiner—George Goudreau
Attorney, Agent, or Firm—Hill, Steadman & Simpson

[57] ABSTRACT

A dry etching method for performing anisotropic etching of a layer of a silicon based material without using a chlorofluorocarbon gas, is proposed. Sulfur halides yielding free sulfur (S) into a plasma under conditions of dissociation by electrical discharge, such as $S_2F_2$ or $S_2Cl_2$, are used as main components of the etching gas. This S is used for sidewall protection and for improving selectivity during etching, and is removed by sublimation by heating the wafer after etching. Although etching may be achieved by $S_2F_2$ alone, suitable measures may preferably be used to increase the S/X ratio of an etching reaction system, which is a ratio of the number of atoms of S to that of X or a halogen, because the layer of the silicon based material is highly susceptible to halogen radicals. Specifically, optimum results may be obtained by (a) adding $H_2$, $H_2S$ or $SiH_4$ to the etching gas, (b) introducing hydrogen in advance into an area for etching by ion implantation, (c) using a silicon-containing resist mask, or (d) by coating the surface of a wafer cover with an amorphous silicon layer.

19 Claims, 3 Drawing Sheets

DRY ETCHING METHOD

BACKGROUND OF THE INVENTION

1. Field of the Invention

This invention relates to a dry etching method employed for the preparation of semiconductor devices. More particularly, it relates to a method for anisotropic etching of a layer of silicon based material, such as single crystal silicon, polysilicon, silicide of a refractory metal or polycide, to high accuracy by low temperature etching without employing a chlorofluorocarbon (CFC) gas.

2. Description of Related Art

In keeping up with the recent tendency towards high integration and high performance of semiconductor devices, such as VLSIs or ULSIs, a strong demand has been raised for a technology of etching of a layer of silicon based material, such as single crystal silicon, polysilicon, refractory metal silicide or polycide, in such a manner as to meet the requirements, such as high anisotropy, high etch rate or high selectivity, with a high level.

Typical of the etching processes for single crystal silicon is trench etching for isolation of minor-sized elements or procuring a cell capacity space. Although anisotropic processing with a high aspect ratio pattern is required in this process, the cross-sectional shape of the trench tends to be changed intricately due to fluctuations in mask patterns or etching conditions, so that unusual shapes, such as undercuts or bowing, are encountered frequently to produce difficulties in trench filling or capacity control performed in subsequent steps.

Typical of the etching processes for polysilicon, refractory metal silicide or polycide, on the other hand, is gate processing. Since the pattern width in the gate electrode directly affects sidewall dimensional accuracy in an LDD structure, or channel length of a transistor in which the source-drain region is formed in a self-aligned fashion, the gate processing is similarly in need of extremely high processing accuracy.

Conventionally, for etching the layer of the silicon based material, a chlorofluorocarbon (CFC) gas, as exemplified by CFC113 ($C_2Cl_3F_3$), has been used extensively as an etching gas. Since both F and Cl are contained in the molecule of the CFC gas, high anisotropy may be achieved because etching may proceed both by the radical reaction by radicals such as $F^*$ or $Cl^*$ and by the ion assist reaction by $Cl^+$, $CF_x^+$ or $CCl^+$ ions, whilst sidewall protection may be achieved by a carbonaceous polymer deposited from the gaseous phase.

However, several problems have been pointed out in connection with the CFC gas.

First, carbon contained in the CFC gas deteriorates selectivity with respect to the layer of the silicon oxide ($SiO_2$). The C—O bond exhibits a higher interatomic bond energy than that of the Si—O bond, so that, if carbon is adsorbed on the surface of a layer of the $SiO_2$ based material, the Si—O bond may be weakened, or $SiO_2$ may be reduced to Si, and hence resistivity against halogen-based etchant is lost. This raises a serious problem if gate electrode processing is performed with a thin gate oxide film as an underlying layer.

Secondly, there is a risk of contamination of particles by a carbonaceous polymer. If the design rule for semiconductor devices is refined further in future, the carbonaceous polymer deposited from the gaseous phase is likely to turn out to be a serious source of pollution by particles.

The most serious problem, however, is that the CFC gas is among the factors responsible for destruction of an ozone layer of the earth, and a ban will be placed in the near future on the production and use of the gas. Thus it is incumbent in the domain of dry etching to find out a suitable substitute material for the CFC gas and to establish an effective method of using the substitute material.

Among the techniques thought to be promising for not using the CFC gas, there is a low temperature etching, which is a technique of maintaining the temperature of a substrate to be etched (wafer) at a temperature not higher than 0° C. to freeze or suppress the radical reaction on the pattern sidewall to prevent occurrence of shape unusualties, such as undercuts, while maintaining the etchrate along the depth at a practical level by the ion assist effect. In Extended Abstracts of the 35th Spring Meeting (1988) of the Japan Society of Applied Physics and Related Societies, page 495, lecture number 28a-G-2, for example, a report has been made of an example in which the wafer was cooled to −130° C. and silicon trench etching and etching of a $n^+$-type polysilicon layer was performed using the $SF_6$ gas.

However, if only freezing or suppression of a radical reaction is resorted to for realization of high anisotropy, a lower temperature which may be realized by using liquid nitrogen is necessitated, as discussed above. This raises a problem in hardware aspects because a specific large-sized equipment is necessitated and vacuum sealing is deteriorated in reliability. In addition, the throughput may be lowered and hence economic profitability or productivity may be affected because a time-consuming operation is involved in cooling the wafer and in subsequent heating for resetting the temperature to ambient temperature.

OBJECT AND SUMMARY OF THE INVENTION

In view of the above depicted status of the art, it is an object of the present invention to provide a dry etching method whereby satisfactory anisotropic processing of a layer of a silicon-based material may be achieved without using the CFC gas while the wafer cooling temperature is set within a practical temperature range even although the etching is carried out at a lower temperature.

It has occurred to the present inventors that, by combining wafer cooling to a lower temperature with sidewall protection, anisotropic processing may be carried out at a temperature higher than heretofore to realize a practical low temperature etching process. If such an etching gas is selected that is capable of producing a carbon-free deposition material in a plasma under discharge dissociation conditions, selectivity of the $SiO_2$ based material is not lowered, while pollution by the carbonaceous polymer is not produced. The deposition material should be capable of being removed easily after completion of etching.

As a result of our researches in line with the above, the present inventors' attention has been directed to sulfur as an example of the deposition material. It has now been found that sulfur may be produced in a gaseous phase by discharge dissociation of sulfur halides, having a larger S/X ratio, which ratio is that of the number of sulfur atoms to that of halogen atoms in the molecule. Sulfur is deposited on the wafer surface, depending on the particular etching conditions, if the wafer temperature is controlled to be lower than ambient temperature. Adsorbed sulfur contributes to mask selectivity and underlying layer selectivity on a surface on which ions are incident in a perpendicular direction, while being deposited continuously on the pattern sidewall for exhibiting sidewall protection effects on the pattern sidewall where ions are not incident in a perpendicular direction as a principle. Besides, sulfur remaining on the wafer may easily be removed by sublimation by heating the wafer to 90° to 150° C. after completion of etching without the least risk of pollution by particles.

According to the present invention, the compounds first enumerated as sulfur halides are four sulfur fluorides, namely $S_2F_2$, $SF_2$, $SF_4$ and $S_2F_{10}$. These compounds have been proposed in our preceding Application as main components of an etching gas for a layer of an $SiO_2$ based material. Our preceding proposal in connection with etching of the $SiO_2$ based material has been directed to an ion mode etching based on contribution of $S^+$ or $SF_x^+$. On the other hand, our present proposal is directed to an etching by assisting a $F^*$ radical reaction by the incident energy of the above ions by optimizing the operating conditions.

However, since the layer of the silicon-based material is highly susceptible to attack by halogen radicals, it becomes occasionally necessary to take measures of further reducing the quantity of radicals for improving anisotropy. Thus the present invention also proposes several measures for supplying hydrogen and/or silicon to an etching reaction system with a view toward consumption of excess halogen radicals by hydrogen radicals $H^*$ or silicon radicals $Si^*$.

The first method is to add halogen radical consuming compounds, such as $H_2$, $H_2S$ or silane-based compounds, to the etching reaction system. The halogen radicals, such as $F^*$ or $Cl^*$, derived from sulfur fluoride or sulfur chloride employed in the present invention, are removed out of the system as HF, HCl, $SiCl_x$ or $SiCl_x$. The result is that the apparent S/F ratio or S/Cl ratio of the etching reaction system is increased to accelerate sulfur deposition. If the relative flow rate of the halogen radical consuming compounds is increased during overetching, underlying layer selectivity may be improved and anisotropic shape may be maintained more effectively.

The second method is to introduce hydrogen into an etching area previously by ion implantation. By introducing hydrogen at a predetermined range by controlling the energy of implantation, hydrogen may be yielded concentratedly when the etching depth reaches the vicinity of its range to increase the consumption of the halogen radicals. Simultaneously, sulfur is deposited on the etching bottom to lower the etchrate abruptly. This is effective in providing for a uniform etchrate, regardless of the aperture size, and for suppressing microloading effects.

The third method is to use an etching mask composed of or constituted by a silicon-containing resist material.

The fourth method is to provide an internal component or a dummy component, which at least has a surface composed of a silicon-containing material, in the vicinity of a substrate to be etched (wafer) within the etching device.

If the third or fourth method is used, silicon may be supplied from the etching mask, the internal component or the dummy component into the etching system to contribute to capturing of the excess halogen radicals.

In this manner, according to the present invention, anisotropic etching of the layer of the silicon-based material may be achieved without employing the CFC gas, while high selectivity and low pollution may be achieved simultaneously. The present invention is highly effective in producing a semiconductor device which is designed under refined design rule and which exhibits high performance, high integration and high reliability.

BRIEF DESCRIPTION OF THE DRAWINGS

FIGS. 1a to 1c are schematic cross-sectional views showing a process according to an embodiment of the present invention applied to processing of a polysilicon gate, step by step, wherein FIG. 1a shows the state in which a resist mask is formed on a doped polysilicon layer, FIG. 1b shows the state in which a gate electrode is formed while a sulfur sidewall protection film is being formed, and FIG. 1c shows the state in which the resist mask and the sidewall protection film have been removed.

FIGS. 2a to 2c are schematic cross-sectional views showing a process according to an embodiment of the present invention applied to silicon trench etching, step by step, wherein FIG. 2a shows the state in which hydrogen is ion-implanted on a single crystal silicon substrate, FIG. 2a shows trench etching being performed and FIG. 2c shows the state of completion of trench etching.

DETAILED DESCRIPTION OF THE INVENTION

The present invention will be explained with reference to certain examples which are not intended for limiting the scope of the invention.

EXAMPLE 1

In the present example, the present invention is applied to processing of a polysilicon gate electrode in which a doped polysilicon layer containing n-type impurities is etched using $S_2F_2$.

Figure 1A:
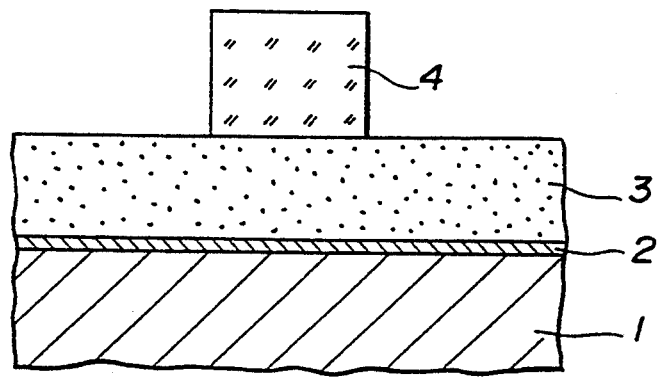

First, a wafer as shown in FIG. 1a was prepared by forming a doped polysilicon layer 3 containing n-type impurities on a single crystal silicon substrate 1 by interposition of an $SiO_2$ gate oxide film 2, and by forming a resist mask 4, patterned to a predetermined contour, on the doped polysilicon layer 3.

The wafer was then set on a wafer setting electrode of a magnetic microwave plasma etching device on which an RF bias voltage was applied. A cooling piping is enclosed within the wafer setting electrode so that the wafer may be cooled by supplying an organic solvent or CFC-based cooling medium, such as a cooling medium manufactured and sold by SUMITOMO 3M under the trade name of Fluorinat, from a cooling equipment, such as a chiller, connected from outside to the etching device, for circulation therein. In the present example, ethanol was used as a cooling medium and the wafer temperature was maintained at approximately $-70°$ C. during etching.

Under this state, the doped polysilicon layer 3 was etched under the typical conditions of the $S_2F_2$ flow rate of 5 SCCM, a gas pressure of 1.3 Pa (10 mTorr), a microwave power of 850 W (2.45 GHz) and an RF bias power of 30 W (2 MHz).

During this etching process, etching proceeded by a mechanism in which a radical reaction by F* dissociated from $S_2F_2$ was assisted by SF+ or $S_x$+ ions similarly derived from $S_2F_2$. Free sulfur was also yielded from $S_2F_2$ and deposited on a pattern sidewall of the cooled wafer surface, where ions are not incident in the perpendicular direction, for forming a sidewall protection film 5 as shown for example in FIG. 1b. As a result, a gate electrode 3a with good shape anisotropy was formed.

Meanwhile, high selectivity to the gate oxide film 2 could be achieved by this process because reactivity of radicals on the wafer surface was lowered due to wafer cooling and the RF bias power could be lowered as a result of sidewall protection. For example, the RF bias power is not more than 20 V in terms of a self bias voltage $V_{dc}$ which is extremely low as an incident ion energy. Such process is highly effective in view of the recent tendency towards a thinner thickness of the gate oxide film.

In addition, by using the low bias voltage as above, pollution by carbonaceous polymer particles may be prevented because a resist mask 4 was not sputtered out for improving resist selectivity, while pollution by particles of the carbonaceous polymer could be prevented.

Then, after setting the wafer temperature to ambient temperature, the wafer was transferred to a plasma ashing device to carry out usual plasma ashing with oxygen. The result is that, as shown in FIG. 1c, the resist mask 4 was removed by a combustion reaction, at the same time that the sidewall protection film 5 was removed promptly. It is noted that formation of $SO_x$ due to the reaction of combustion and heating of the wafer due to the heat of reaction and the heat of plasma radiation participate in a mechanism of removal of the sidewall protection film 5. The result is that no pollution by particles occur red on the wafer.

Although removal of the sidewall protection film 5 was carried out simultaneously with ashing of the resist mask 4, the sidewall protection film 5 may be removed by sublimation before ashing by heating the wafer to approximately 90° C. continuously even after the wafer was reset to ambient temperature following low temperature etching.

EXAMPLE 2

In the present Embodiment, the present invention was applied to processing of a polysilicon gate electrode and a doped polysilicon layer was etched using a gas mixture of $S_2F_2$ as sulfur halide and $H_2$ as a halogen radical consuming compound.

A wafer shown in FIG. 1a was first set in a magnetic microwave plasma etching device, and a doped polysilicon layer 3 was etched under the typical conditions of the $S_2F_2$ flow rate of 20 SCCM, an $H_2$ flow rate of 10 SCCM, a gas pressure of 1.3 Pa (10 mTorr), a microwave power of 850 W (2.45 GHz), an RF bias power of 30 W (2 MHz) and a wafer temperature of −70° C.

The mechanism of etching in the present example is substantially similar to that of example 1. However, a part of F* dissociated from $S_2F_2$ was consumed by H* derived from $H_2$. The S/F ratio of $S_2F_2$ is 1. Sulfur fluorides having the S/F ratio higher than this has not been known to date as a stable compound. However, with F* radicals thus consumed by H*, the apparent S/F ratio is raised further to suppress the reaction by radicals to improve the effect of sidewall protection by sulfur correspondingly.

Figure 1B:
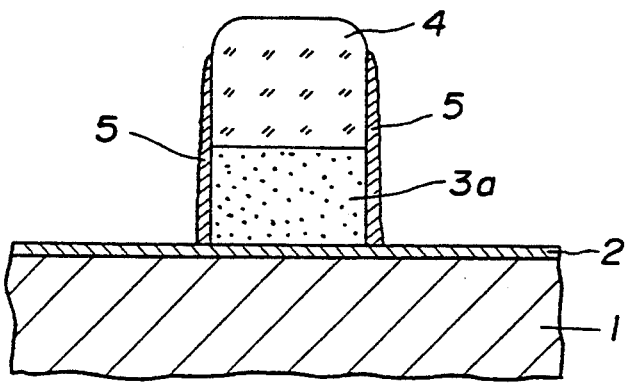
Figure 1C:
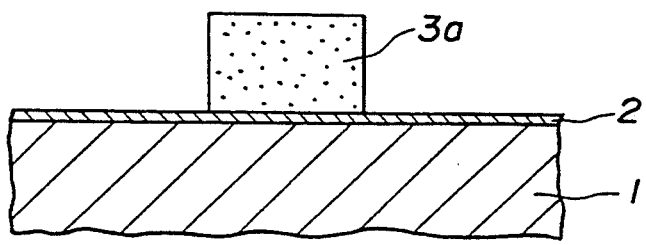

As a result, the gate electrode 3a having good shape anisotropy as shown in FIGS. 1a and 1b could be formed without producing undercuts below the resist pattern 4. The sidewall protection film 5 could be removed easily by sublimation, as shown in FIGS. 1b and 1c, by heating the wafer after completion of etching.

EXAMPLE 3

In the present Embodiment, the present invention was similarly applied to processing of a polysilicon gate electrode and a doped polysilicon layer was etched using a gas mixture of $S_2F_2$ as sulfur halide and $H_2S$ as a halogen radical consuming compound.

A wafer shown in FIG. 1a was first set in a magnetic microwave plasma etching device, and a doped polysilicon layer 3 was etched under the typical conditions of the $S_2F_2$ flow rate of 20 SCCM, an $H_2S$ flow rate of 10 SCCM, a gas pressure of 1.3 Pa (10 mTorr), a microwave power of 850 W (2.45 GHz), an RF bias power of 30 W (2 MHz ) and a wafer temperature of −70° C.

The mechanism of etching of the present example was similar to that of example 2. However, since sulfur was also contained in the halogen radical consuming compound ($H_2S$), the apparent S/F ratio was improved further, while selectivity and sidewall protection effects were also increased.

EXAMPLE 4

In the present Embodiment, the present invention was similarly applied to processing of a polysilicon gate electrode and a doped polysilicon layer was etched using a gas mixture of $S_2F_2$ as sulfur halide and monosilane $SiH_4$ as a halogen radical consuming compound.

A wafer shown in FIG. 1a was first set in a magnetic microwave plasma etching device, and a doped polysilicon layer 3 was etched under the typical conditions of the $S_2F_2$ flow rate of 20 SCCM, an $SiH_4$ flow rate of 5 SCCM, a gas pressure of 1.3 Pa (10 mTorr), a microwave power of 850 W (2.45 GHz), an RF bias power of 30 W (2 MHz) and a wafer temperature of −70° C.

The mechanism for etching of the present example is similar to that of example 2. However, since the halogen radical consuming compound $SiH_4$ yielded both Si* and F*, the S/F ratio was improved markedly, while selectivity and sidewall protection effects were improved further.

It is noted that, although $SiH_4$ was used in the present example as a silane-based compound, silicon hydride, such as $Si_2H_6$ or $Si_3H_8$ or partially halogenated derivatives thereof, such as $SiH_2F_2$ or $SiH_2Cl_2$, may also be employed.

EXAMPLE 5

In the present example, in which the present invention is applied to processing of a polysilicon gate electrode, after the etching of the doped polysilicon layer was substantially completed at a first step in the same manner as in example 2, a second step of overetching was carried out under the condition in which the flow rate of $H_2$ to $S_2F_2$ was set so as to be larger than that in the first step.

In the present example, the wafer shown in FIG. 1a and the magnetic microwave plasma etching device were again employed.

In the first step, the doped polysilicon layer 3 was just-etched, that is, etching was so performed that the layer 3 was mostly etched but some portion of which remains unetched, under the conditions of the $S_2F_2$ flow rate of 20 SCCM, an $H_2$ flow rate of 10 SCCM, a gas pressure of 1.3 Pa (10 mTorr), a microwave power of 850 W (2.45 GHz), an RF bias power of 30 W (2 MHz) and a wafer temperature of −70° C.

The gate electrode layer 3a with good shape anisotropy may be produced by this just-etching process. However, for improving selectivity of the underlying gate oxide film 2 and maintaining good shape anisotropy in the course of the subsequent overetching, it is necessary to improve the S/F ratio further.

Thus, in the second step, the gas supplying conditions were changed to the $S_2F_2$ flow rate of 10 SCCM and the $H_2$ flow rate of 20 SCCM.

Under these conditions, removal of the gate oxide film 2 could be suppressed to a minimum, while no undercuts were produced, even when overetching by approximately 50% was performed.

It is noted that, although only the gas supplying conditions were changed in the second step as compared to those of the first step, underlying layer selectivity could be improved by lowering the RF bias power or increasing the RF bias frequency in the second step.

EXAMPLE 6

In the present example, the present invention is applied to trench processing in which hydrogen was previously introduced by ion implantation into a single crystal substrate to a depth not less than the desired trench depth and etching was carried out using $S_2Cl_2$. The present example is explained by referring to FIGS. 2a to 2c.

Figure 2A:
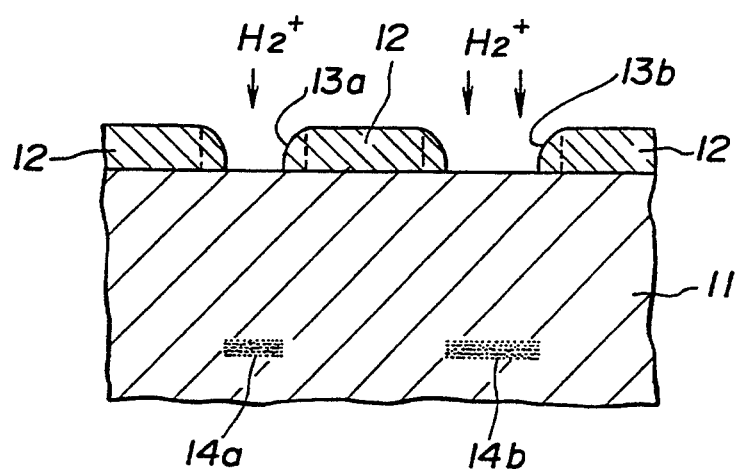

A wafer in which silicon oxide etching mask 12 was formed on a single crystal substrate 11 as shown for example in FIG. 2a was prepared. The etching mask 12 had a sidewall formed by etchback by reactive ion etching (RIE). In this manner, a first aperture 13a was approximately 0.2 μm in diameter which is in excess of the limit of resolution of the present status of photolithography. A second aperture 13b was approximately 0.5 μm in diameter.

$H_2^+$ ions were then implanted at a dosage of approximately $10^{16}$ atoms/cm$^2$ into the single crystal substrate 11 through the first aperture 13a and the second aperture 13b. As a result, high hydrogen concentration regions 14a, 14b were formed to a depth of not less than 2 μm from the surface of the single crystal silicon substrate 11. It is noted that the energy of ion implantation may be controlled for setting the range to a value approximately equal to the desired trench depth.

This wafer was set in a magnetic microwave plasma etching device and, as an example, the single crystal silicon substrate 11 was etched under the conditions of the $S_2F_2$ flow rate of 5 SCCM, a gas pressure of 1.3 Pa (10 mTorr), a microwave power of 850 W (2.45 GHz), an RF bias power of 100 W (2 MHz) and a wafer temperature of −70° C.

Figure 2B:
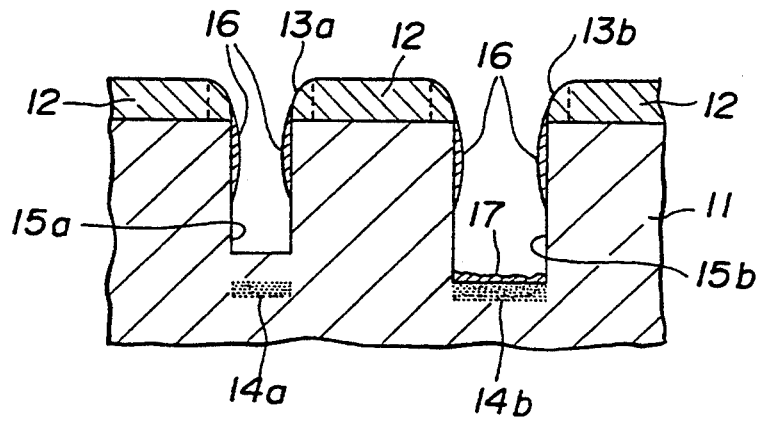
Figure 2C:
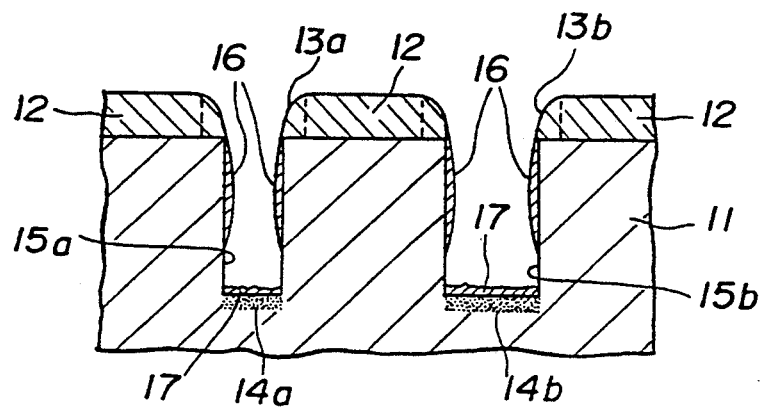
Figure 3:
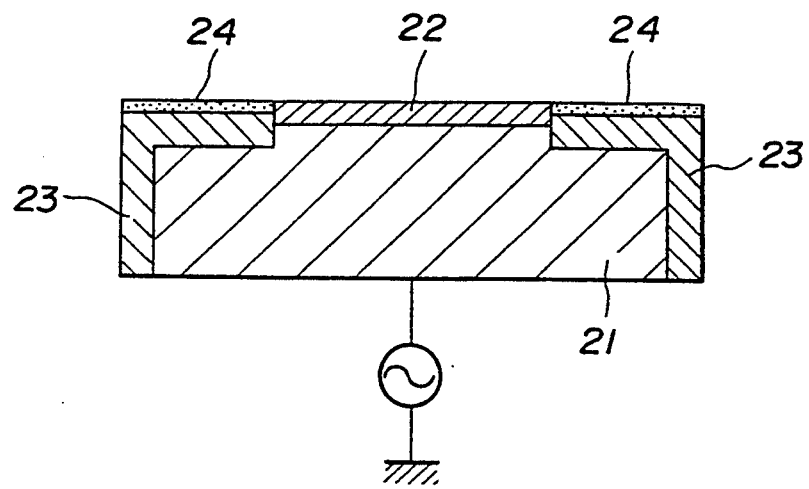
FIG. 3 is a schematic cross-sectional view showing an example of a cathode cover with a surface which has been covered with an amorphous silicon layer.

Since $S_2Cl_2$ has a melting point of −80° C. and a boiling point of 137° C., and hence is a liquid material at ambient temperature, it was gasified by bubbling using an He gas before being introduced into the system. During this process, an ion assist reaction by $S^+$, $Cl_x^+$ or $SCl^+$ ions and the radical reaction by $Cl^*$ radicals proceeded simultaneously to effect etching at a high etchrate, while sulfur yielded from $S_2Cl_2$ was deposited on a pattern sidewall to produce a sidewall protection film 16 for forming trenches 15a, 15b with high anisotropy. Since the efficiency of incidence of active etchants is higher at the second aperture 13b than at the aperture 13a narrower than the aperture 13b, the etch rate was higher at the second aperture 13b. As a result, in the course of etching, the bottom of the trench 15b within the second aperture 13b first reached a region of high hydrogen concentration 14b, as shown in FIG. 2b.

With the conventional etching process, the trenches 15a and 15b tend to differ from each other markedly in depth under the microloading effects. However, according to the present invention, $Cl^*$ are consumed at this stage by hydrogen supplied from the region of high hydrogen concentration 14b so that the apparent S/Cl ratio is increased abruptly. The result is that formation of sulfur deposit 17 on the bottom of the trench 15b proceeds competitively with removal thereof by sputtering so that the etchrate is lowered. As a result, the trench 15b was scarcely increased in depth.

As etching proceeded further, the bottom of the trench 15a reached a region of high hydrogen concentration 14a and a sulfur deposit 17 was formed by the same effect. Since etching was substantially terminated, the trenches 15a and 15b having different diameters were formed to substantially the same depth without being affected by the microloading effects.

EXAMPLE 7

In the present example, the present invention was applied to processing of a polycide gate electrode using $S_2F_2$ in which an etching mask was formed by a resist material having a siloxane based novolac resin as a base resin. The present example is not explained with reference to the drawings because the doped polycide film 3 shown in FIG. 1a may be thought of as a polycide film formed by formation of a doped polysilicon layer and a tungsten silicide layer step by step.

A polycide film was formed on a single crystal silicon substrate by interposition of a gate oxide film to form a wafer on which a positive type photoresist produced by FUJI HUNT KK under the trade name of FH-SP was applied. A resist mask was formed by photolithography using an i-line. This photoresist material is a mixture of a siloxane based novolac resin with a quinone diazide compound as a photo sensitive material and has a silicon content of 20 wt. %.

This wafer was set in a magnetic microwave plasma etching device, and a polycide film was etched under the typical conditions of the $S_2F_2$ flow rate of 5 SCCM, a gas pressure of 1.3 Pa (10 mTorr), a microwave power of 850 W (2.45 GHz), an RF bias power of 50 W (2 MHz ) and a wafer temperature of −30° C.

In the course of the present process, since silicon in the etching mask captured $F^*$ dissociated from $S_2F_2$, the apparent S/F ratio was increased and sulfur was deposited on the pattern sidewall. This sulfur exhibited sidewall protection effects so that a polycide gate electrode having good anisotropic profile could be produced.

Meanwhile, in certain conventional etching of a polycide film, a Br-based gas, such as HBr, is added to an etching gas for fear of deterioration in anisotropy, and reaction products, such as $SiBr_x$ or $WBr_x$ exhibiting low vapor pressure, are used for sidewall protection. Since these reaction products are not used in the present invention, there is only little risk of pollution by particles or dimensional changes.

Meanwhile, the resist material used in the present invention is not limited to the above given value of its silicon content and any desired commercially available resist material may be employed. However, it should be borne in mind that, if the silicon content is too high, resolution tends to be lowered, even although resistance to oxygen plasma is improved.

EXAMPLE 8

In the present example, the present invention is applied to processing of a polysilicon gate electrode in which a doped polysilicon layer was etched using $S_2F_2$ and a cathode cover provided with an amorphous silicon layer on its surface as a cathode cover of a magnetic microwave plasma etching device.

An alumina cathode cover 23 provided with an amorphous silicon layer 24 on its upper surface by plasma CVD or the like process was herein used for covering an exposed portion of a wafer setting electrode 21 for preventing metal pollution from the exposed portion to a wafer 22. The thickness of the amorphous silicon layer 24 was suitably set depending on the number of wafers 22 to be processed by the processing device by one-by-one operation.

The wafer setting electrode 21, wafer 22 and the cathode cover 23 were held together by silicon carbide clamps, not shown, at several positions, and a doped polysilicon layer was etched under the typical conditions of the $S_2F_2$ flow rate of 5 SCCM, a gas pressure of 1.3 Pa (10 mTorr), a microwave power of 850 W (2.45 GHz), an RF bias power of 50 W (2 MHz) and a wafer temperature of $-30°$ C.

In this case, since the layer of a material homogeneous with the material to be etched was present around the wafer 22, an effect similar to an increased etching area (loading effect) was achieved, so that excess F* radicals yielded on dissociation from $S_2F_2$ were consumed by the amorphous silicon layer 24. In this manner, the apparent S/F ratio was increased and effective sidewall protection was achieved by sulfur so that a gate electrode with excellent shape anisotropy was formed.

Meanwhile, an internal member within the etching device, at least the surface of which is formed of a silicon-based material, is not limited to the above mentioned cathode cover, but may be a clamp or susceptor, if these are provided in proximity to the wafer. The amorphous silicon layer on the surface of the internal member may also be replaced by an SiN thin film. The above component may also be cut from a silicon ingot or formed of a silicon based sintered ceramics, such as silicon carbide. As a highly simplified alternative method, similar effects may be obtained by arraying suitable solid members, such as blocks or sputtering targets of silicon based material, around the wafer as dummy components.

Silicon oxide materials are not preferred because etching of the silicon based material is usually performed while high selectivity of the silicon oxide material is maintained and hence silicon is not supplied to the etching reaction system.

The etching gas employed in each of the seven examples described above may be added to by inert gases, such as $N_2$, for controlling the etchrate or augmenting the effects of sidewall protection. The etching gas may also be added to by rare gases, such as He or Ar, in expectation of sputtering, dilution or cooling effects.

It is to be noted that the above described various aspects of the present invention may also be combined to produce synergistic effects if the halogen radicals are not drastically reduced to suppress the etching reaction.

What is claimed is:

1. A dry etching method comprising etching a layer of a silicon based material using an etching gas consisting essentially of a sulfur fluoride selected from the group consisting of $S_2F_2$, $SF_2$, $SF_4$ and $S_2F_{10}$, and said etching including protecting side walls by depositing sulfur thereon.

2. The dry etching method as claimed in claim 1 wherein the layer of the silicon based material is selected from a single crystal silicon, a polysilicon, a refractory metal silicide and polycide.

3. A dry etching method comprising etching a layer of a silicon based material using an etching gas consisting of a sulfur halide selected from the group consisting of $S_2F_2$, $SF_2$, $SF_4$, $S_2F_{10}$, $S_3Cl_2$, $S_2Cl_2$ and $SCl_2$ and at least one halogen radical consuming compound selected from $H_2$, $H_2S$ and a silane based compound, said etching including protecting side walls by depositing sulfur thereon.

4. The dry etching method as claimed in claim 3 wherein the layer of the silicon based material is selected from a single crystal silicon, a polysilicon, a refractory metal silicide and polycide.

5. A dry etching method comprising a first step of etching a layer of a silicon based material to a depth substantially limited to a thickness of the layer of silicon based material using an etching gas consisting of sulfur halide selected from the group consisting of $S_2F_2$, $SF_2$, $SF_4$, $S_2F_{10}$, $S_3Cl_2$, $S_2Cl_2$ and $SCl_2$ and at least one halogen radical consuming compound selected from $H_2$, $H_2S$ and a silane based compound with a first flow ratio of the halogen radical consuming compound to said sulfur halide, and a second step of overetching using a second flow ratio of said halogen radical consuming compound to said sulfur halide higher than said first ratio.

6. The dry etching method as claimed in claim 5 wherein the layer of the silicon based material is selected from a single crystal silicon, a polysilicon, a refractory metal silicide and polycide.

7. A dry etching method comprising introducing hydrogen in advance by ion implantation into an area for etching and etching a layer of a silicon based material using an etching gas consisting of a sulfur halide selected from the group consisting of $S_2F_2$, $SF_2$, $SF_4$, $S_2F_{10}$, $S_3Cl_2$, $S_2Cl_2$ and $SCl_2$ and said etching including protecting side walls by depositing sulfur thereon.

8. The dry etching method as claimed in claim 7 wherein the layer of the silicon based material is selected from a single crystal silicon, a polysilicon, a refractory metal silicide and polycide.

9. A dry etching method comprising etching a layer of a silicon based material using an etching gas consisting of a sulfur halide selected from the group consisting of $S_2F_2$, $SF_2$, $SF_4$, $S_2F_{10}$, $S_3Cl_2$, $S_2Cl_2$ and $SCl_2$, and using an etching mask being composed of a silicon-containing resist material.

10. The dry etching method as claimed in claim 9 wherein the layer of the silicon based material is selected from a single crystal silicon, a polysilicon, a refractory metal silicide and polycide.

11. A dry etching method comprising arranging an internal member or a dummy component, which has at least a surface which comprises a silicon containing material, in the vicinity of a substrate to be etched, and etching a layer of a silicon based material using an etching gas consisting essentially of a sulfur halide selected from the group consisting of $S_2F_2$, $SF_2$, $SF_4$, $S_2F_{10}$, $S_3Cl_2$, $S_2Cl_2$ and $SCl_2$, said etching including depositing sulfur to provide sidewall protection.

12. The dry etching method as claimed in claim 11 wherein said silicon containing material is at least one selected from amorphous silicon, silicon nitride, silicon ingot and silicon carbide.

13. The dry etching method as claimed in claim 11 wherein said internal member is at least one selected from a cathode cover, a wafer susceptor and a wafer clamp.

14. The dry etching method as claimed in claim 11 wherein the layer of the silicon based material is selected from a single crystal silicon, a polysilicon, a refractory metal silicide and polycide.

15. A dry etching method comprising etching a layer of a silicon-based material using an etching gas consisting essentially of a sulfur halide selected from the group consisting of $S_2F_2$, $SF_2$, $SF_4$, $S_2F_{10}$, $S_3Cl_2$, $S_2Cl_2$ and $SCl_2$, by providing means for consuming excess halogen radicals and by depositing sulfur on side walls for protection from etching.

16. A dry etching method according to claim 15, wherein providing means for consuming comprises providing at least one halogen radical consuming compound selected from $H_2$, $H_2S$ and a silane-based compound.

17. A dry etching method according to claim 15, wherein providing means for consuming comprises introducing hydrogen before etching by ion implantation into an area for etching.

18. A dry etching method according to claim 15, wherein providing means for consuming excess halogen radicals includes using an etching mask composed of a silicon-containing resist material.

19. A dry etching method according to claim 15, wherein providing means for consuming excess halogen radicals includes arranging an internal component with at least a surface of a silicon-containing material in the vicinity of a substrate to be etched.

* * * * *